(12) United States Patent
Cheng et al.

(10) Patent No.: US 10,090,327 B2
(45) Date of Patent: Oct. 2, 2018

(54) SEMICONDUCTOR DEVICE AND METHOD FOR FORMING THE SAME

(71) Applicant: Taiwan Semiconductor Manufacturing Co., Ltd., Hsin-Chu (TW)

(72) Inventors: Kuo-Yu Cheng, Tainan (TW); Keng-Yu Chen, Tainan (TW); Wei-Kung Tsai, Tainan (TW); Kuan-Chi Tsai, Kaohsiung (TW); Tsung-Yu Yang, Zhubei (TW); Chung-Long Chang, Dou-Liu (TW); Chun-Hung Chen, Xinpu Township, Hsinchu County (TW); Chih-Ping Chao, Juhdong Town (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 184 days.

(21) Appl. No.: 14/158,430

(22) Filed: Jan. 17, 2014

(65) Prior Publication Data
US 2015/0206902 A1     Jul. 23, 2015

(51) Int. Cl.
*H01L 27/12* (2006.01)
*H01L 27/06* (2006.01)
(Continued)

(52) U.S. Cl.
CPC ...... *H01L 27/1203* (2013.01); *H01L 21/0262* (2013.01); *H01L 21/02532* (2013.01); *H01L 21/02595* (2013.01); *H01L 21/28194* (2013.01); *H01L 21/30604* (2013.01); *H01L 21/31111* (2013.01); *H01L 21/763* (2013.01); *H01L 21/7624* (2013.01); *H01L 21/76264* (2013.01); *H01L 21/84* (2013.01); *H01L 23/66* (2013.01); *H01L 28/20* (2013.01);
(Continued)

(58) Field of Classification Search
CPC ........... H01L 21/76286; H01L 21/7624; H01L 2223/6672; H01L 27/1203; H01L 21/78264; H01L 27/0629; H01L 29/7408; H01L 2924/1207; H01L 21/76264
USPC ........................................................ 257/505
See application file for complete search history.

(56) References Cited

U.S. PATENT DOCUMENTS 5,276,338 A * 1/1994 Beyer ................. H01L 21/2007
257/501
6,355,537 B1 * 3/2002 Seefeldt ............ H01L 21/76264
257/524

(Continued)

OTHER PUBLICATIONS

Pending U.S. Appl. No. 13/782,355, filed Mar. 1, 2013.

*Primary Examiner* — Matthew Reames
*Assistant Examiner* — John Bodnar
(74) *Attorney, Agent, or Firm* — McClure, Qualey & Rodack, LLP

(57) ABSTRACT

Embodiments for forming a semiconductor device structure are provided. The semiconductor device structure includes a substrate and a buried oxide layer formed over the substrate. An interface layer is formed between the substrate and the buried oxide layer. The semiconductor device structure also includes a silicon layer formed over the buried oxide layer; and a polysilicon layer formed over the substrate and in a deep trench. The polysilicon layer extends through the silicon layer, the buried oxide layer and the interface layer.

19 Claims, 7 Drawing Sheets

(51) Int. Cl.
    *H01L 21/306*     (2006.01)
    *H01L 21/311*     (2006.01)
    *H01L 21/28*     (2006.01)
    *H01L 23/66*     (2006.01)
    *H01L 21/762*     (2006.01)
    *H01L 21/02*     (2006.01)
    *H01L 49/02*     (2006.01)
    *H01L 21/84*     (2006.01)
    *H01L 21/763*     (2006.01)
    *H01L 23/522*     (2006.01)

(52) U.S. Cl.
    CPC ...... *H01L 23/5223* (2013.01); *H01L 23/5227* (2013.01); *H01L 23/5228* (2013.01); *H01L 27/0629* (2013.01); *H01L 2223/6672* (2013.01); *H01L 2924/0002* (2013.01)

(56) References Cited

U.S. PATENT DOCUMENTS

| | | | |
|---|---|---|---|
| 6,638,844 B1* | 10/2003 | Verma | H01L 21/76224 257/516 |
| 2004/0002197 A1* | 1/2004 | Fathimulla | H01L 21/76254 438/455 |
| 2007/0252731 A1* | 11/2007 | Chung | H01L 21/761 341/50 |
| 2008/0122025 A1* | 5/2008 | Roggenbauer | H01L 21/76264 257/501 |
| 2010/0032796 A1* | 2/2010 | Brown | H01L 21/76289 257/510 |
| 2013/0330891 A1* | 12/2013 | Chang | H01L 21/84 438/241 |

\* cited by examiner

SEMICONDUCTOR DEVICE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The implementation of silicon-on-insulator (SOI) technology is one of several manufacturing strategies employed to allow the continued miniaturization of microelectronic devices, which may be referred to as extending Moore's Law. Reported benefits of SOI technology relative to silicon (bulk complementary metal-oxide-semiconductor (CMOS)) processing may include, for example, lower parasitic capacitance due to isolation from the bulk silicon, which improves power consumption at matched performance, and resistance to latch-up due to isolation of the n- and p-well structures.

From a manufacturing perspective, SOI substrates are compatible with most fabrication processes. Indeed, an SOI-based process may be implemented without special equipment or significant retooling of an existing factory. The SOI process may be used to form an integrated circuit having a metal-oxide-semiconductor field-effect transistor (MOSFET) area and a radio frequency (RF) area. However, there are challenges for forming the RF area.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
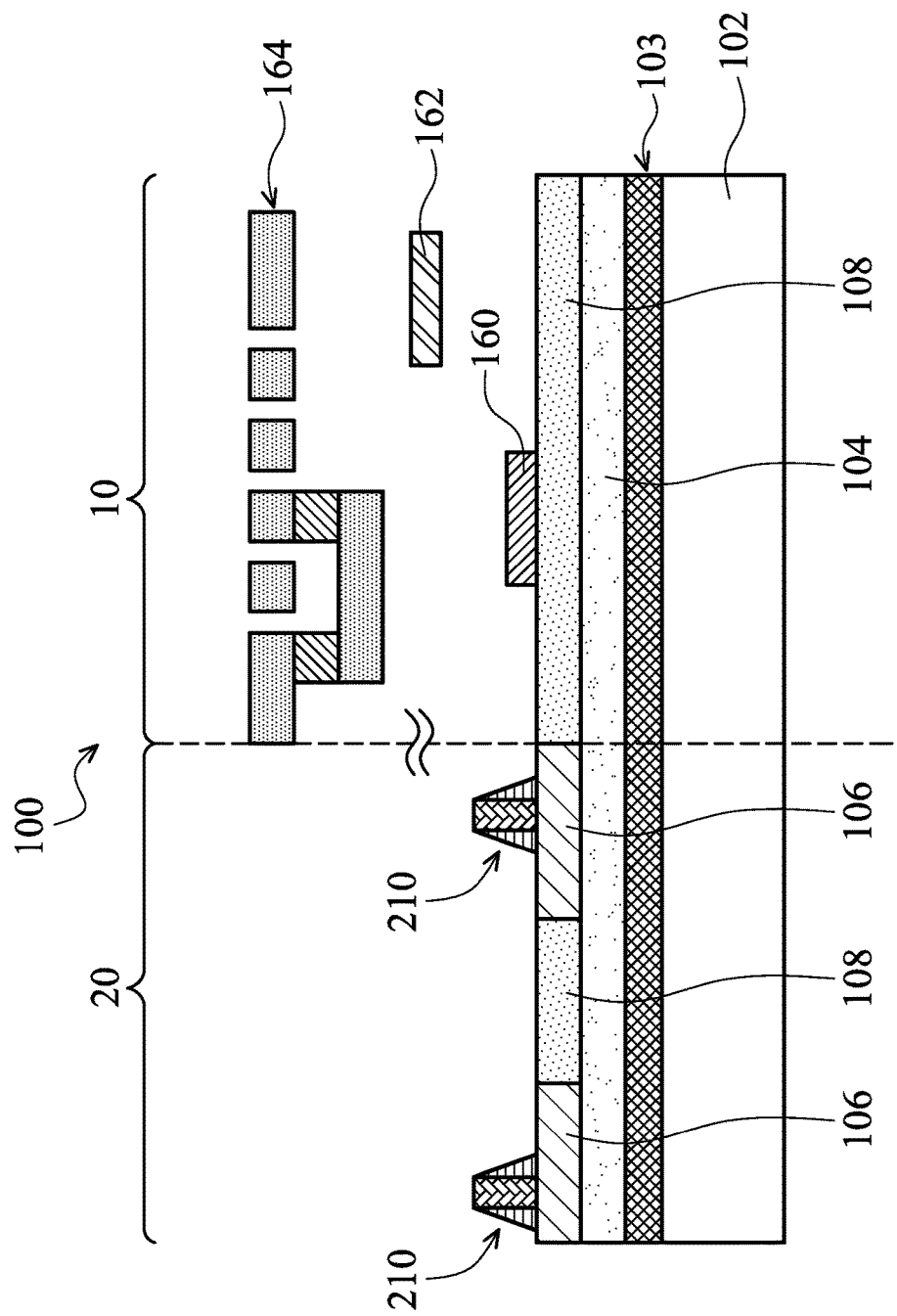
FIG. 1 shows a cross-sectional representation of an integrated circuit including a radio frequency (RF) area and a metal-oxide-semiconductor field-effect transistor (MOSFET) area in accordance with some embodiments of the disclosure.

Embodiments for forming a radio frequency (RF) area of a semiconductor device structure are provided. FIG. 1 shows a cross-sectional representation of a semiconductor device structure 100 including an RF area 10 and a metal-oxide-semiconductor field-effect transistor (MOSFET) area 20 in accordance with some embodiments of the disclosure. However, it should be noted that FIG. 1 has been simplified for the sake of clarity to better understand the inventive concepts of the disclosure. Additional features can be added to integrated circuit 100, and some of the features below can be replaced or eliminated.

Referring to FIG. 1, each of RF area 10 and MOSFET area 20 includes a substrate 102 and a buried oxide (BOX) layer 104. Substrate 102 is silicon or a silicon-containing material. Substrate 102 is a high-resistance (high-R) substrate. In some embodiments, the substrate 102 has a resistance in a range from about 750 ohms-centimeter to 10000 ohms-centimeter.

Portions of substrate 102 and buried oxide layer 104 at or near an interface between substrate 102 and buried oxide layer 104 interact with each other. The interacting portions of substrate 102 and buried oxide layer 104 behave much like a low-resistance (low-R) or lossy layer. Therefore, a low-resistance layer 103 has been depicted at the interface between substrate 102 and buried oxide layer 104. For ease of illustration, the thickness of low-resistance layer 103 has been exaggerated. The resistance of substrate 102 is higher than that of low-resistance layer 103. In some embodiments, low-resistance layer 103 has a resistance is in a range from about 12 ohms-centimeter to about 749 ohms-centimeter.

Referring to FIG. 1, MOSFET area 20 includes a silicon (Si) layer 106 separated by a shallow trench isolation (STI) region 108. Silicon layer 106 and STI region 108 are disposed over buried oxide layer 104 in MOSFET area 20. A silicon-on-insulator (SOI) substrate is constructed by silicon layer 106 formed over buried oxide layer 104. As shown in FIG. 1, the opposing portions of silicon layer 106 in MOSFET area 20 support a transistor structure 210.

RF area 10 also includes STI region 108. As shown, STI region 108 is formed over buried oxide layer 104. In some embodiments, RF area 10 includes a passive devices, such as a resistor 160, a capacitor 162, and interconnect structure 164. Interconnect structure 164 is used to suitably couple RF area 10 with another device (e.g., an inductor, a transmission line, etc.). In other words, interconnect structure 164 may be an inductor interconnect or a transmission line interconnect.

Low-resistance layer 103, which is inhomogeneous, may degrade the radio frequency performance of integrated circuit 100. For example, low-resistance layer 103 may permit eddy-current losses to adversely impact the quality factor (Q-factor) of an inductor. In addition, low-resistance layer 103 may cause unacceptable insertion losses for a transmission line. This is due, at least in part, to unexpected charges forming at or around the interface between high-resistance substrate 102 and buried oxide layer 104.

Figure 2A:
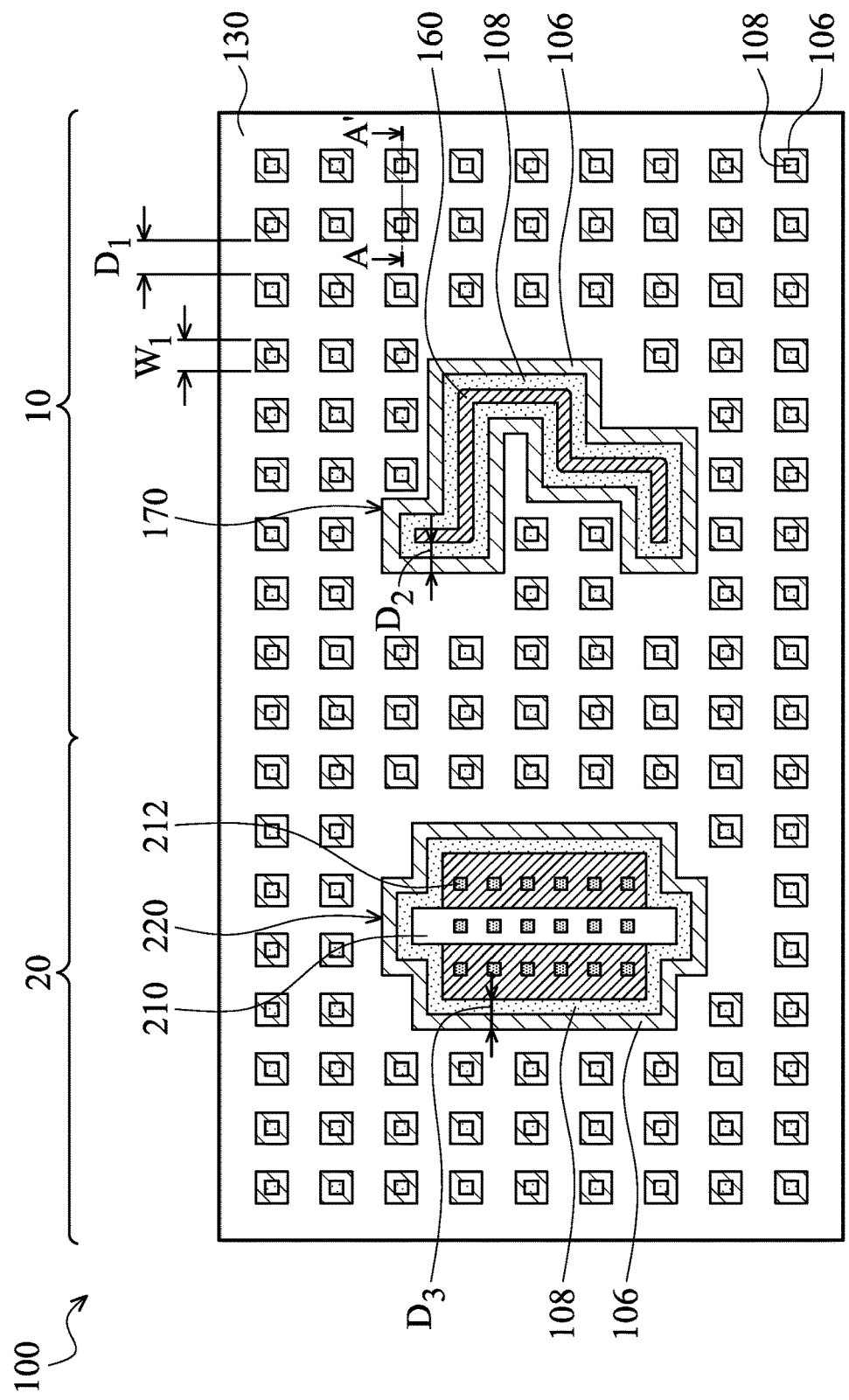
FIG. 2A shows a top-view of an integrated circuit including a radio frequency (RF) area and a metal-oxide-semiconductor field-effect transistor (MOSFET) area in accordance with some embodiments of the disclosure.

FIG. 2A shows a top-view of integrated circuit 100 including RF area 10 and MOSFET area 20 in accordance with some embodiments of the disclosure. As depicted in the top view, STI region 108 is surrounded or encircled by silicon layer 106.

RF area 10 includes a resistor region 170 having resistor 160. MOSFET area 20 includes a field-effect transistor (FET) region 220 having silicon layer 106, transistor structure 210 and contacts 212. Contacts 212 are formed above silicon layer 106 and transistor structure 210 to electrically connect to metal lines (not shown).

As shown in FIG. 2A, STI regions 108 and silicon layer 106 are arranged in a regular pattern. The regular pattern may have a square, circular, or rectangular shape. In other words, as depicted in the top view, a polysilicon layer 130 is formed between two adjacent patterns to form a fence-like shape. In some other embodiments, STI region 108 and silicon layer 106 are arranged in an irregular pattern.

In some embodiments, the pattern including STI regions 108 and silicon layer 106 has a width $W_1$ in a range from about 0.5 um to about 10 um. In some embodiments, the distance $D_1$ between two adjacent patterns is in a range from about 0.5 um to about 100 um. In RF area 10, the distance $D_2$ between resistor 160 and polysilicon layer 130 is a range from about 0.1 um to about 50 um. In MOSFET area 20, the distance $D_3$ between silicon layer 106 and polysilicon layer 130 is a range from about 0.1 um to about 50 um.

Figure 2B:
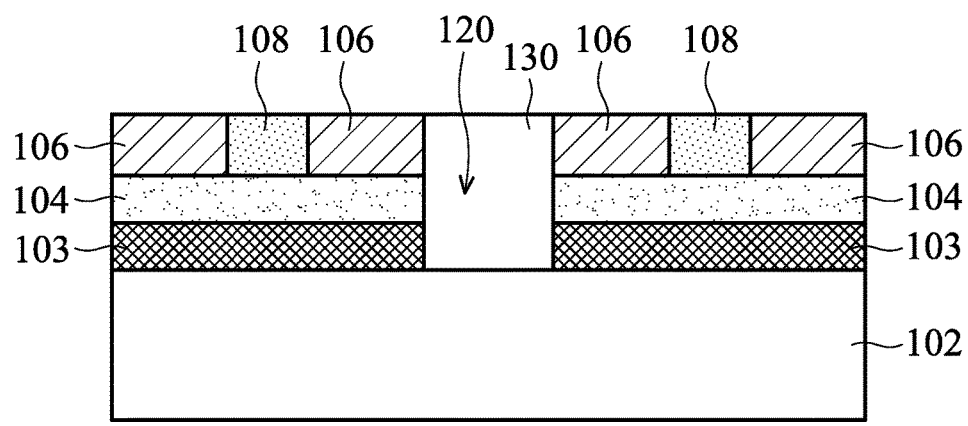
FIG. 2B shows a cross-sectional representation along AA' line in FIG. 2A in accordance with some embodiments of the disclosure.

FIG. 2B shows a cross-sectional representation along AA' line in FIG. 2A. Two adjacent patterns including STI regions 108 and silicon layer 106 are separated by a deep trench (DT) 120. Polysilicon layer 130 is formed in deep trench 120. Formations of deep trench 120 and polysilicon layer 130 will be described in detail later.

FIG. 3A-3E show cross-sectional representations of various stages of forming RF area 10 having deep trench (DT) 120, in accordance with some embodiments of the disclosure.

Figure 3A:
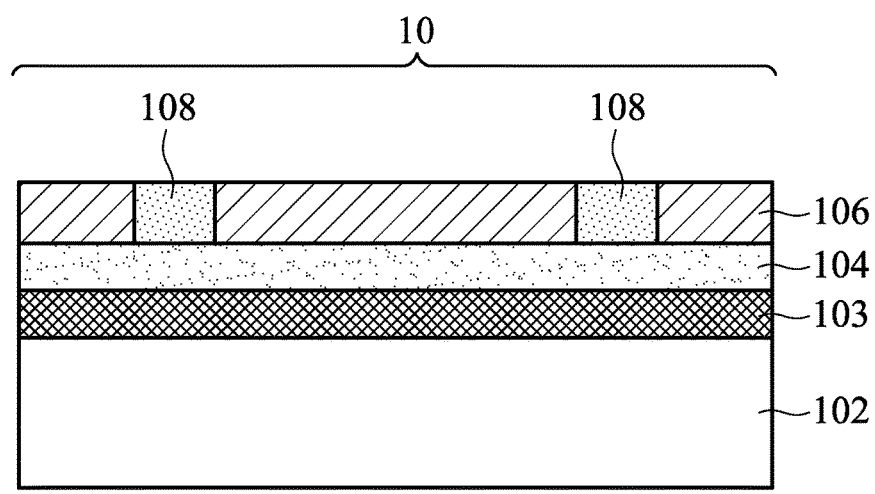
FIG. 3A-3E show cross-sectional representations of various stages of forming a radio frequency area having a deep trench (DT) in accordance with some embodiments of the disclosure.

Referring to FIG. 3A, RF area 10 includes substrate 102, low-resistance layer 103, buried oxide layer 104, silicon layer 106 and STI region 108. A portion of STI region 108 is formed on either side of, or separated by a portion of silicon layer 106. In addition, STI region 108 and silicon layer 106 are all formed over buried oxide layer 104. In some embodiments, a thin layer of silicon oxide layer (not shown) is formed or grown over silicon layer 106 by a thermal oxidation process.

Figure 3B:
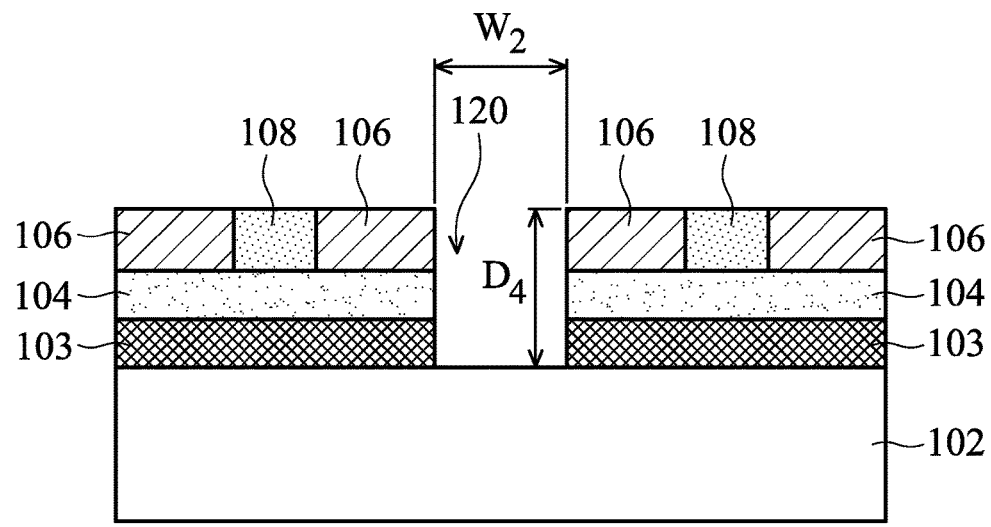

After forming silicon layer 106 and STI region 108, deep trench 120 is formed by etching through silicon layer 106, buried oxide layer 104 and low-resistance layer 103 as shown in FIG. 3B in accordance with some embodiments of the disclosure. It should be noted that deep trench 120 passes through low-resistance layer 103, the conduction of low-resistance layer 103 is blocked by deep trench 120.

Deep trench 120 is formed by a photolithography process and etching process. The photolithography process includes processing steps of photoresist coating, soft baking, mask aligning, exposing, post-exposure baking, developing photoresist and hard baking. The etching process includes a wet etching process or a dry etching process.

In some embodiments, deep trench 120 has a width $W_2$ in a range from about 0.5 um to about 100 um. If width $W_2$ of deep trench 120 is too small, unexpected insertion losses are increased. If width $W_2$ of deep trench 120 is too large, deep trench 120 may occupy too much space.

As shown in FIG. 3B, deep trench 120 is formed through low-resistance layer 103 and above the top surface of substrate 102. In some other embodiments, deep trench 120 extends into substrate 102. In some embodiments, deep trench 120 has a depth $D_4$ in a range from about 0.5 um to about 10 um.

Figure 3C:
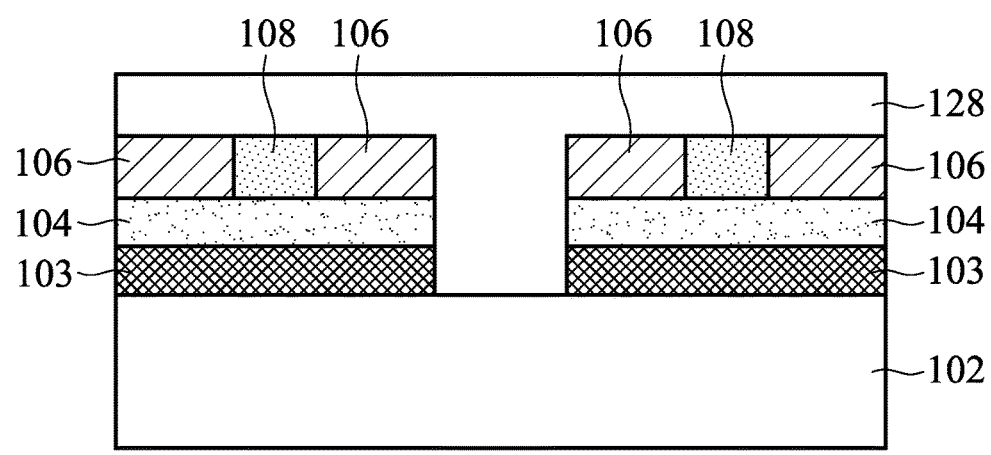

After deep trench 120 is formed, polysilicon 128 is formed in deep trench 120 and on silicon layer 106 and STI region 108, as shown in FIG. 3C in accordance with some embodiments of the disclosure. In some embodiments, polysilicon 128 is formed by a chemical vapor deposition (CVD) process, physical vapor deposition (PVD) process, atomic layer deposition (ALD) or other applicable process.

Figure 3D:
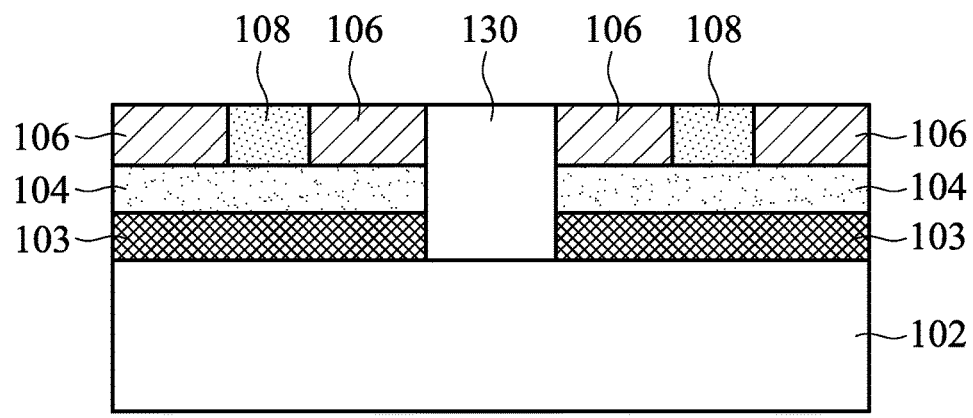

After polysilicon 128 is filled into deep trench 120, a planarizing process is performed to remove the excess of polysilicon 128 as shown in FIG. 3D in accordance with some embodiments of the disclosure. As a result, polysilicon layer 130 is formed in deep trench 120.

It should be noted that polysilicon layer 130 is configured to forms a barrier to block the migration of electrons. Polysilicon layer 130 has poly-crystalline structure. It should be noted that, compared with substrate 102 with single-crystalline structure, the molecules in polysilicon layer 130 with a poly-crystalline structure are arranged irregularly. Therefore the migration of electrons is further blocked by polysilicon layer 130.

It should be noted that the opposing portions of low-resistance layer 103 (or interface layer) are separated from each other by polysilicon layer 130 in deep trench 120. In addition, by formation of polysilicon layer 130, the eddy current produced from resistor 160, capacitor 162 or interconnect structure 164 will decrease obviously. Furthermore, the cross talk between substrate 102 and RF device (such as resistor 160 or capacitor 162) also decreased.

In some embodiments, a top surface of polysilicon layer 130 is substantially level with a top surface of silicon layer 106. In some embodiments, planarization process is a chemical polishing (CMP) process.

Figure 3E:
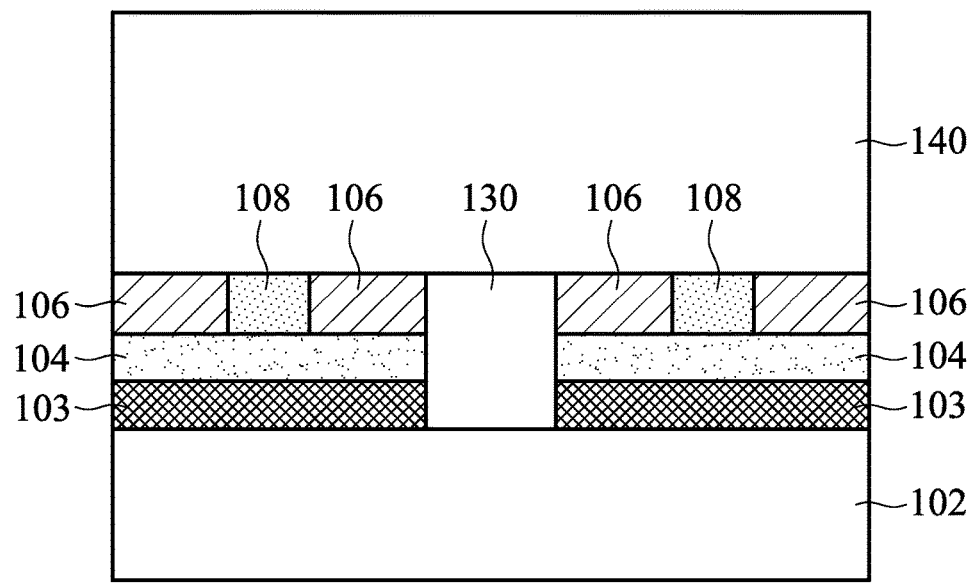

After polysilicon layer 130 is formed, interlayer dielectric (ILD) layer 140 is formed as shown in FIG. 3E in accordance with some embodiments of the disclosure. Interlayer dielectric (ILD) layer 140 is formed on polysilicon layer 130, silicon layer 106 and STI region 108.

ILD layer 140 is made of silicon oxide, doped or undoped silicon oxide, undoped silicate glass (USG), phosphorus-doped silicon glass (PSG), boron phosphorus silicate glass (BPSG), phenyl triethoxy silicate (PTEOS) or boron phosphorous tetraethyl silicate (BPTEOS). ILD 140 is formed by a chemical vapor deposition (CVD) process, high-density plasma CVD process (HDP CVD), spin coating or deposition furnace.

Before forming interlayer dielectric (ILD) layer 140 (as shown in FIG. 3E), an etch stop layer (not shown) may be conformally formed in deep trench 120 and on silicon layer 106. In some embodiments, the etch stop layer is silicon nitride (SiN).

After forming polysilicon layer 130, substrate 102 may continue with other processes to form other devices above ILD 140, such as capacitor 162, or interconnect structure 164. The above-mentioned processes may be combined in a normal logic process and take full advantage of the silicon-on-insulator (SOI) process.

From the description above, deep trench 120 is formed through low-resistance layer 103. As a result, the conduction of low-resistance layer 103 is blocked by deep trench 120. In addition, polysilicon layer 130 formed in deep trench 120 to block the migration of electrons. Therefore, unexpected insertion losses or eddy currents are decreased by the formation of deep trench 120 and polysilicon layer 130 (by the etching process and deposition process).

Figure 4:
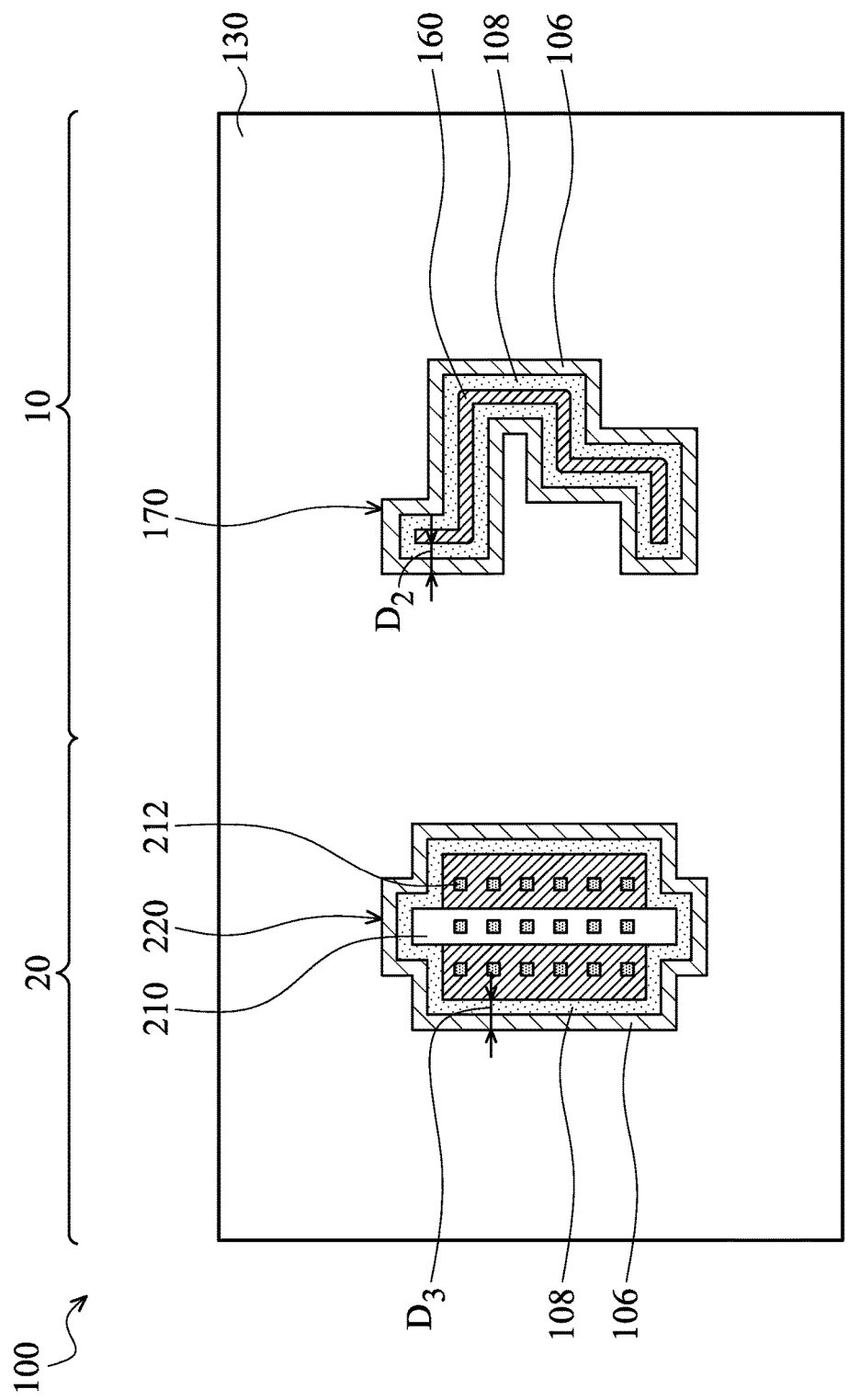
FIG. 4 shows a top-view of an integrated circuit including a radio frequency (RF) area and a metal-oxide-semiconductor field-effect transistor (MOSFET) area in accordance with some embodiments of the disclosure.

FIG. 4 shows a top-view of an integrated circuit including RF area 10 and MOSFET area 20 in accordance with some embodiments of the disclosure. FIG. 4 is similar to FIG. 2A, the difference is that the overall area of integrated circuit 100 is occupied by polysilicon layer 130 except for resistor region 170 and FET region 220 in FIG. 4. In other words, the overall area of integrated circuit 100 is occupied by a pattern of deep trench 120 except for resistor region 170 and FET region 220.

As shown in FIG. 4, as depicted in the top view, resistor region 170 is surrounded by polysilicon region 130, and FET region 220 is also surrounded by polysilicon region 130. In other words, resistor region 170 and FET region 220 are separated by polysilicon layer 130.

Figure 5:
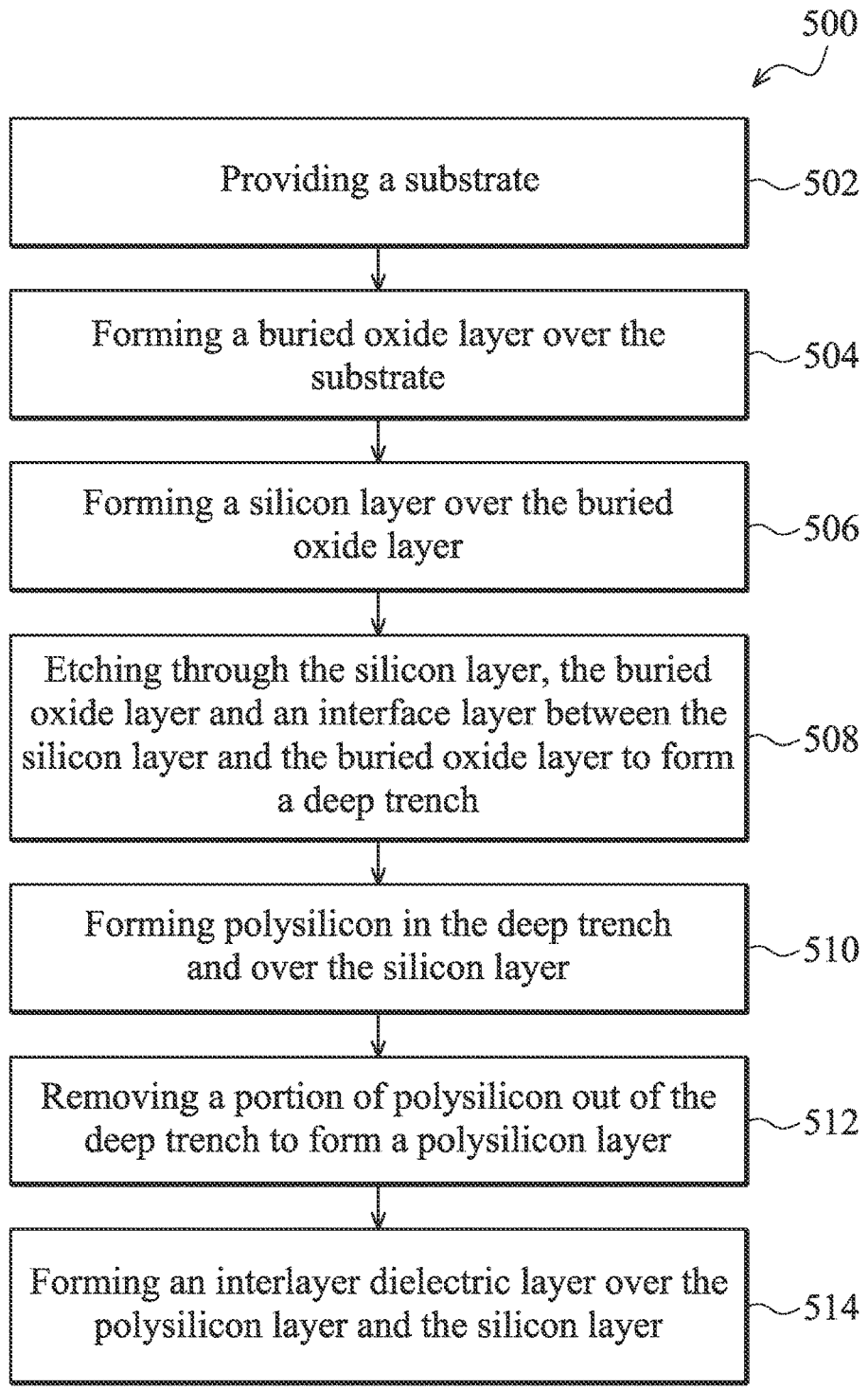
FIG. 5 shows a flowchart of a method for forming a radio frequency area having a deep trench (DT) in accordance with some embodiments of the disclosure.

FIG. 5 shows a flowchart of a method for forming a radio frequency area having a deep trench (DT) in accordance with some embodiments of the disclosure.

In operation 502, substrate 102 is provided. Substrate 102 is a high-resistance (high-R) substrate.

In operation 504, buried oxide (BOX) layer 104 is formed over substrate 102. Therefore, low-resistance layer (or interface layer) 103 is formed between substrate 102 and buried oxide layer 104. The resistance of substrate 102 is higher than that of low-resistance layer 103.

In operation 506, silicon layer 106 is formed over buried oxide layer 104. In addition, STI region 108 is also formed over buried oxide layer 104. A portion of STI region 108 is formed on either side of, or separated by a portion of silicon layer 106.

In operation 508, silicon layer 106, buried oxide layer 104 and low-resistance layer 103 (or interface layer) are etched to form deep trench 120. A portion of substrate 102 is exposed by deep trench 120.

In operation 510, polysilicon 128 is formed in deep trench 120. Polysilicon 128 is deposited in deep trench 120 and over silicon layer 106. In some embodiments, polysilicon 128 is formed by a chemical vapor deposition (CVD) process, physical vapor deposition (PVD) process, atomic layer deposition (ALD) or other applicable process.

In operation 512, a portion of polysilicon 128 out of deep trench 120 is removed to form polysilicon layer 130. In some embodiments, the portion of polysilicon 128 is removed by a planarization process, such as a chemical polishing (CMP) process.

In operation 514, an interlayer dielectric (ILD) layer 140 is formed over polysilicon layer 130, silicon layer 106 and STI region 108.

Embodiments for forming a semiconductor device structure are provided. An interface layer (or low-resistance layer) is formed between a high-resistance substrate and a buried oxide (BOX) layer. In order to eliminate the negative effects of the low-resistance layer, a deep trench (DT) is formed through the low-resistance layer. Afterwards, a polysilicon layer is formed in the deep trench to block the migration of electrons. Therefore, unexpected insertion losses or eddy currents are decreased by formation of the deep trench and the polysilicon layer.

In some embodiments, a semiconductor device structure is provided. The semiconductor device structure includes a substrate and a buried oxide layer formed over the substrate. An interface layer is formed between the substrate and the buried oxide layer. The semiconductor device structure also includes a silicon layer formed over the buried oxide layer; and a polysilicon layer formed over the substrate and in a deep trench. The polysilicon layer extends through the silicon layer, the buried oxide layer and the interface layer.

In some embodiments, a semiconductor device structure is provided. The semiconductor device structure includes a substrate having a first resistance and a buried oxide layer formed over the substrate. The semiconductor device structure also includes an interface layer formed between the substrate and the buried oxide layer. The interface layer has a second resistance lower than the first resistance. The semiconductor device structure further includes a silicon layer formed over the buried oxide layer and a polysilicon layer formed over the substrate and in a deep trench. The polysilicon layer extends through the silicon layer, the buried oxide layer and the interface layer. The semiconductor device structure includes an interlayer dielectric layer formed on the polysilicon layer and the silicon layer.

In some embodiments, a method for forming a semiconductor device structure is provided. The method includes providing a substrate and forming a buried oxide layer over the substrate. An interface layer is formed between the substrate and the buried oxide layer. The method also includes forming a silicon layer over the buried oxide layer and etching through the silicon layer, the buried oxide layer and the interface layer to form a deep trench. The method further includes forming a polysilicon layer in the deep trench.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device structure, comprising:
a substrate;
a buried oxide layer formed over the substrate, wherein an interface layer is formed between the substrate and the buried oxide layer;
a plurality of patterns formed over the buried oxide layer, wherein each of the patterns comprises:
a plurality of first isolation structures formed over the buried oxide layer;
a plurality of first silicon structures surrounding the first isolation structures;
a polysilicon layer formed over the substrate, wherein the polysilicon layer extends through the first silicon structures, the buried oxide layer and the interface layer; and
a resistor formed over the buried oxide layer, wherein a top-view of the resistor is entirely surrounded by a second enclosed isolation structure, and the second enclosed isolation structure is surrounded by the polysilicon layer, and a top-view of the patterns surrounds the resistor and the second enclosed isolation structure.

2. The semiconductor device structure as claimed in claim 1, further comprising:
an interlayer dielectric layer formed on the polysilicon layer and the first silicon structures.

3. The semiconductor device structure as claimed in claim 1, wherein a first resistance of the substrate is higher than a second resistance of the interface layer.

4. The semiconductor device structure as claimed in claim 3, wherein the first resistance is in a range from about 750 to about 10000 ohms-centimeter.

5. The semiconductor device structure as claimed in claim 1, wherein the interface layer has a resistance that is inhomogeneous.

6. The semiconductor device structure as claimed in claim 1, wherein the polysilicon layer has a depth in a range from about 0.5 um to about 10 um.

7. The semiconductor device structure as claimed in claim 1, wherein the polysilicon layer has a width in a range from about 0.5 um to about 100 um.

8. A semiconductor device structure, comprising:
a substrate having a first resistance, wherein the substrate comprise a RF area and a MOSFET area;
a buried oxide layer formed over the substrate;
an interface layer formed between the substrate and the buried oxide layer, wherein the interface layer has a second resistance lower than the first resistance;
a plurality of patterns formed over the buried oxide layer, wherein each of the patterns comprises:
a plurality of first isolation structures formed over the buried oxide layer;
a plurality of first silicon structures surrounding the first isolation structures;
a polysilicon layer formed over the substrate, wherein the polysilicon layer extends through the first silicon structures, the buried oxide layer and the interface layer;
a transistor structure formed over the substrate in the MOSFET area; and
a resistor formed over the substrate in the RF area, wherein a top-view of the resistor is entirely surrounded by a second enclosed isolation structure, and the second enclosed isolation structure and the first isolation structure are separated by the polysilicon layer.

9. The semiconductor device structure as claimed in claim 8, wherein the opposing portions of the interface layer are separated from each other by the polysilicon layer.

10. The semiconductor device structure as claimed in claim 8, wherein the polysilicon layer has a depth in a range from 0.5 um to 10 um.

11. The semiconductor device structure as claimed in claim 1, further comprising:
a transistor structure formed over the substrate, wherein a top-view of the transistor structure is entirely surrounded by a third enclosed isolation structure, and the polysilicon layer is formed between the second enclosed isolation structure and the third enclosed isolation structure, and the polysilicon layer is in direct contact with the first silicon structures.

12. The semiconductor device structure as claimed in claim 8, wherein a top-view of the transistor structure is entirely surrounded by a third enclosed isolation structure, and the polysilicon layer is formed between the second enclosed isolation structure and the third enclosed isolation structure, and the polysilicon layer is in direct contact with the first silicon structures.

13. The semiconductor device structure as claimed in claim 1, wherein the patterns comprise a first pattern and a second pattern, the first pattern comprises a first sidewall in a first direction, the second pattern comprises a second sidewall in the first direction, and the first sidewall of the first pattern is aligned with the second sidewall of the second pattern.

14. The semiconductor device structure as claimed in claim 13, wherein the patterns further comprise a third pattern, the third pattern comprises a third sidewall in the first direction, and the third sidewall of the third pattern is aligned with the second sidewall of the second pattern.

15. The semiconductor device structure as claimed in claim 1, wherein the second enclosed isolation structure is surrounded by a second silicon structure, and the patterns and the second silicon structure are separated by the polysilicon layer.

16. The semiconductor device structure as claimed in claim 1, wherein the patterns and the resistor have different shapes.

17. The semiconductor device structure as claimed in claim 8, wherein the patterns and the resistor have different shapes.

18. A semiconductor device structure, comprising:
a buried oxide layer formed over a substrate, wherein an interface layer is formed between the substrate and the buried oxide layer;
a plurality of patterns formed over the buried oxide layer, wherein each of the patterns comprises:
a plurality of first isolation structures formed over the buried oxide layer;
a plurality of first silicon structures surrounding the first isolation structures;
a polysilicon layer formed over the substrate, wherein the polysilicon layer extends through the first silicon structures, the buried oxide layer and the interface layer, wherein the patterns align with one another and are separated by the polysilicon layer;

a resistor formed over the substrate, wherein a top-view of the resistor structure is entirely surrounded by a second enclosed isolation structure, and the patterns surround the resistor.

19. The semiconductor device structure as claimed in claim 18, wherein the patterns and the resistor have different shapes.

* * * * *